United States Patent
Hunter et al.

(10) Patent No.: US 10,958,285 B2
(45) Date of Patent: Mar. 23, 2021

(54) DYNAMIC VOLTAGE REFERENCE FOR DELTA-SIGMA ANALOG-TO-DIGITAL CONVERTER (ADC) WITH TEMPERATURE TRIM CALIBRATION

(71) Applicant: TEXAS INSTRUMENTS INCORPORATED, Dallas, TX (US)

(72) Inventors: Bradford Lawrence Hunter, Spicewood, TX (US); Xiaopeng Li, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/881,642

(22) Filed: May 22, 2020

(65) Prior Publication Data
US 2020/0373940 A1   Nov. 26, 2020

Related U.S. Application Data

(60) Provisional application No. 62/852,445, filed on May 24, 2019.

(51) Int. Cl.
*H03M 3/00* (2006.01)

(52) U.S. Cl.
CPC .......... *H03M 3/384* (2013.01); *H03M 3/378* (2013.01); *H03M 3/432* (2013.01)

(58) Field of Classification Search
CPC ....... H03M 3/384; H03M 3/432; H03M 3/378
USPC .................................... 341/143, 120
See application file for complete search history.

(56) References Cited

U.S. PATENT DOCUMENTS

| 7,511,648 | B2* | 3/2009 | Trifonov | H03M 1/145 341/118 |
| 8,106,809 | B2* | 1/2012 | Groenewold | H03M 3/34 341/172 |

* cited by examiner

*Primary Examiner* — Khai M Nguyen
(74) *Attorney, Agent, or Firm* — Michael A. Davis, Jr.; Charles A. Brill; Frank D. Cimino (57) ABSTRACT

A calibratable switched-capacitor voltage reference and an associated calibration method are described. The voltage reference includes dynamic diode elements providing diode voltages, input capacitor(s) for sampling input voltages, base-emitter capacitor(s) for sampling one diode voltage with respect to a ground, dynamically trimmable capacitor(s) for sampling the one diode voltage with respect to another diode voltage, and an operational amplifier coupled to the capacitors for providing reference voltage(s) based on the sampled input and diode voltages and on trims of the trimmable capacitor(s). The voltage reference can be configured as a first integrator of a modulator stage of a delta-sigma analog-to-digital converter.

20 Claims, 7 Drawing Sheets

DYNAMIC VOLTAGE REFERENCE FOR DELTA-SIGMA ANALOG-TO-DIGITAL CONVERTER (ADC) WITH TEMPERATURE TRIM CALIBRATION

CROSS-REFERENCE TO RELATED APPLICATION

This application claims priority to U.S. provisional patent application No. 62/852,445, filed May 24, 2019.

TECHNICAL FIELD

This description relates generally to electronic circuits, and more particularly to a dynamic voltage reference for a delta-sigma analog-to-digital converter (ADC) with temperature trim calibration.

BACKGROUND

An example voltage reference circuit is configured to output a voltage that is as stable (constant) in amplitude as possible, in view of the loading on the device, power supply variations, temperature changes, and the passage of time. Voltage references are used in power supplies and in a variety of on-chip applications.

An analog-to-digital converter (ADC) converts an analog signal into a digital signal. For example, ADCs integrate, or sample, analog signals at a sampling frequency and quantization in a multi-level quantizer to achieve corresponding digital signals. Delta-sigma (ΔΣ) ADCs can employ delta-sigma modulation to provide dynamic ranges beyond what is possible with other ADC architectures. As one example, a ΔΣ ADC samples an input signal at a rate higher than the Nyquist frequency using an oversampling modulator, which is followed by a digital decimation filter. Together, the oversampling modulator and the digital decimation filter produce a high-resolution data-stream output.

SUMMARY

An example integrated circuit (IC) includes a single-ended or differential switched-capacitor voltage reference that includes dynamic diode elements configured to provide first and second diode voltages. The voltage reference includes an input capacitor configured to sample an input voltage. The voltage reference includes a base-emitter capacitor configured to sample the first diode voltage with respect to a ground. The voltage reference includes a dynamically trimmable capacitor configured to sample the first diode voltage with respect to the second diode voltage. The voltage reference includes an operational amplifier (op amp) coupled at an op amp input to the input capacitor, the base-emitter capacitor, and the dynamically trimmable capacitor. The op amp is configured to provide a reference voltage based on the sampled input voltage, the first and second diode voltages, and a trim of the trimmable capacitor. For example, the voltage reference can be configured as a first integrator of a modulator stage of a delta-sigma analog-to-digital converter (ADC).

In an example method of calibrating a voltage reference, which is configured as a first integrator of a delta-sigma ADC, an input to a trimmable capacitor of a differential switched-capacitor voltage reference is grounded. An external test reference voltage is applied to a base-emitter capacitor of the voltage reference. A maximum external input voltage is applied to an input capacitor of the voltage reference. An uncorrected output code from the ADC is recorded and stored. Dynamic diode element voltages are applied to the base-emitter capacitor and the trimmable capacitor. The maximum external input voltage is applied to the input capacitor. Trim control bits controlling a trim of the trimmable capacitor are then adjusted until a new output code from the ADC matches the stored uncorrected output code. The method can include applying digital gain calibration to adjust the new output code to a target code with the maximum external input voltage applied.

Another example system includes a delta-sigma ADC having an analog modulator. The analog modulator includes a single-ended or differential switched-capacitor voltage reference configured as a first-stage integrator of the analog modulator. The voltage reference includes a dynamically trimmable capacitor configured to receive a trim control signal to adjust its capacitance. The ADC has a multi-bit output configured to produce a digital output code based on an input voltage provided to the voltage reference and the trim control signals. The system may include a digital-logic gain calibration circuit coupled to the multi-bit output of the ADC and configured to adjust the digital output code with a gain trim to provide a gain-calibrated output code.

DETAILED DESCRIPTION

In various applications, a voltage reference is useful to generate a stable (e.g., temperature-stable) reference voltage and compare it against an input voltage in a system, e.g., a voltage supplied by a system battery. The comparison can be digitized using an analog-to-digital converter (ADC), such as a delta-sigma ADC, which may be referred to as an oversampling converter, that in effect builds up an average value of the input voltage over a large number of cycles using an analog modulator made of integrators and then decimates the oversampled signal to build up a single bitstream. System control decisions or warning signals can be based on the digitized comparison of the input voltage with the reference voltage. The voltage reference, ADC, and associated circuitry can be fabricated on an integrated circuit (IC), for example.

After circuit fabrication, the voltage reference can be calibrated, or "trimmed," for optimally accurate output at one or multiple different temperatures, depending on its design. A single-temperature-trim voltage reference is useful in cost-sensitive applications that do not demand the additional circuit complexity and, therefore, the additional cost of calibration that can ensure accuracy at multiple different temperatures. An application utilizing a delta-sigma modulator can implement a dynamic reference synthesized with an ADC integrator. Dynamic element matching and component chopping are useful to eliminate sources of error that contribute to the inaccuracy of the voltage reference. Synthesis involves a transistor's base-emitter voltage ($V_{be}$) and the difference between two base-emitter voltages ($\Delta V_{be}$) being sampled onto a pair of capacitors connected to the input of the ADC integrator. Minimum temperature drift of the synthesized reference can be at least partially achieved by making the capacitor ratio a fixed quantity. Capacitor mismatch generates effective ratio error yielding temperature drift in the accuracy of the voltage reference. Accordingly, as the voltage reference circuit's temperature becomes further away from the temperature at which it has been trimmed (calibrated), its output becomes less accurate. In contrast, it is desirable for a voltage reference to show stability in output across a range of temperatures.

Figure 1:
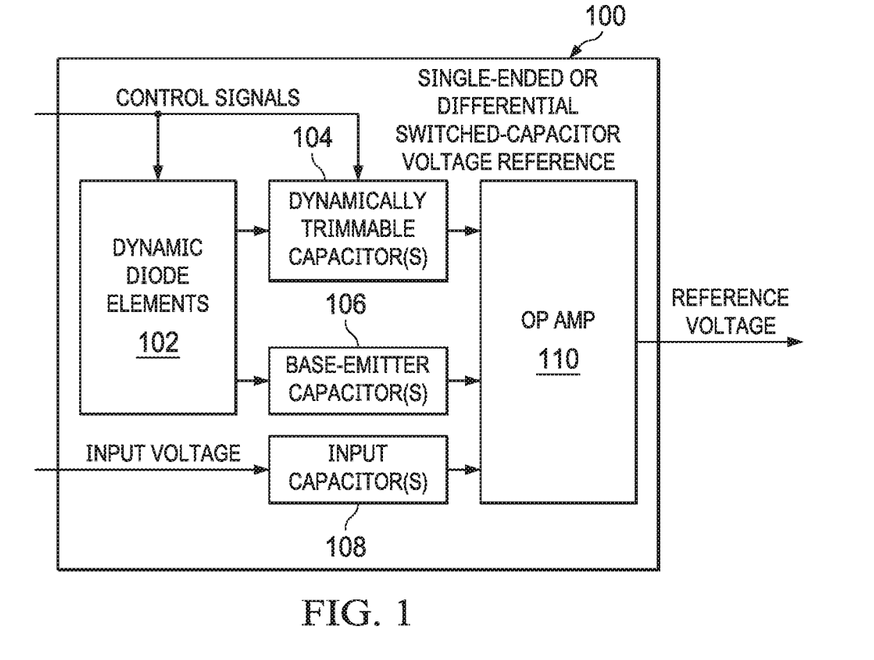
FIG. 1 is a block diagram of an example differential switched-capacitor voltage reference having dynamically trimmable capacitors.

FIG. 1 is a block diagram of an example differential switched-capacitor voltage reference 100 configured to produce a reference voltage that is substantially stable across temperature. Control signals and an input voltage can be provided as inputs to voltage reference 100. For example, control signals can be provided to dynamic diode elements 102, which can be configured to provide diode voltages. The input voltage, which can be differential and thus be supplied as two separate voltages, can be supplied to input capacitors 108, which can be configured to sample the input voltage. Base-emitter capacitors 106 can be configured to sample a first diode voltage from dynamic diode elements 102 with respect to a ground. Control signals can also be provided to dynamically trimmable capacitors 104, which can be configured to sample the first diode voltage with respect to a second diode voltage provided by dynamic diode elements 102. The capacitance value of dynamically trimmable capacitors can be adjusted based on the control signals. Voltage reference 100 can include a differential operational amplifier (op amp) coupled at its differential inputs to the dynamically trimmable capacitors 104, the base-emitter capacitors 106, and the input capacitors 108. The op amp can be configured to provide a (differential) reference voltage based on the sampled input and diode voltages and trims of the trimmable capacitors 104.

Figure 2:
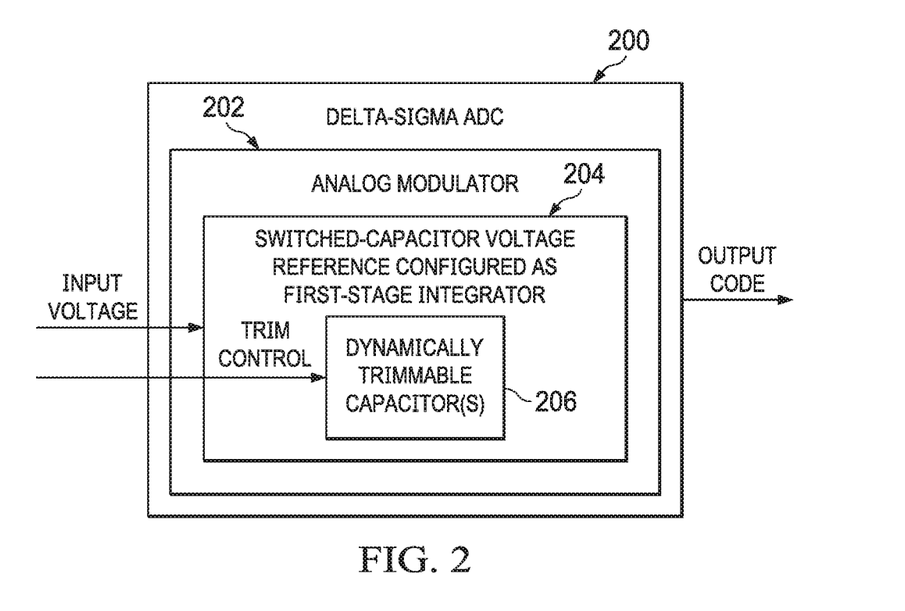
FIG. 2 is a block diagram of an example delta-sigma analog-to-digital converter (ADC) having a voltage reference with trimmable capacitors as the first-stage integrator of the ADC's analog modulator.

FIG. 2 is a block diagram of an example delta-sigma analog-to-digital converter (ADC) 200 that includes an analog modulator 202. The analog modulator 202 includes a differential switched-capacitor voltage reference 204, which is configured as its first-stage integrator. For example, this voltage reference 204 can be voltage reference 100 from FIG. 1. Voltage reference 204 includes dynamically trimmable capacitors 206, which can correspond to dynamically trimmable capacitors 104 of FIG. 1, and can receive trim control signals to adjust their capacitances. ADC 200 can be configured to produce a digital multi-bit output code that is based on the input voltage and the trim control provided to trim the trimmable capacitors 206.

Figure 3:
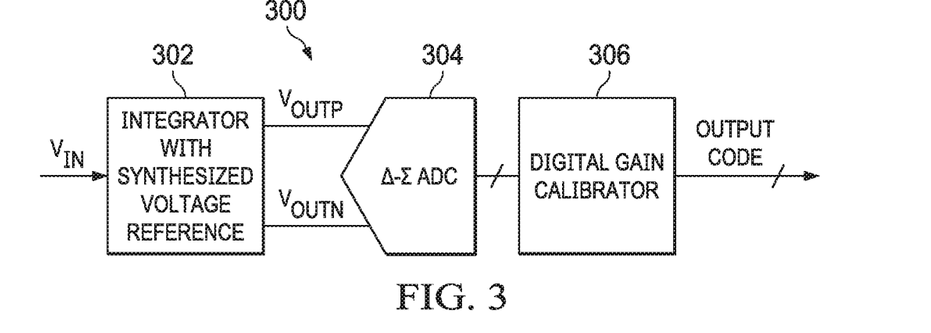
FIG. 3 is a block diagram of an example system including an integrator with synthesized voltage reference, a delta-sigma ADC, and a digital gain calibrator.

FIG. 3 shows an ADC system 300, which includes an integrator 302 with synthesized voltage reference. The integrator 302 has: an input that receives analog input voltage signal $V_{IN}$; and (b) an output that provides differential analog output voltage signals $V_{OUTP}$ and $V_{OUTN}$ to delta-sigma modulator 304. Although not explicitly illustrated, input voltage signal $V_{IN}$ can itself be a differential signal. Although illustrated as being separate from delta-sigma modulator 304, integrator 302 can be viewed as a first integrator of delta-sigma modulator 304 implemented as having multiple integrators in series. Delta-sigma modulator 304 can digitize differential signals $V_{OUTP}$ and $V_{OUTN}$ to produce an uncalibrated output code as a multi-bit digital signal that can be fed into a digital-logic gain calibration circuit 306. Digital-logic gain calibration circuit 306 adjusts the ADC output code with a gain trim to provide a gain-calibrated output code.

Figure 4:
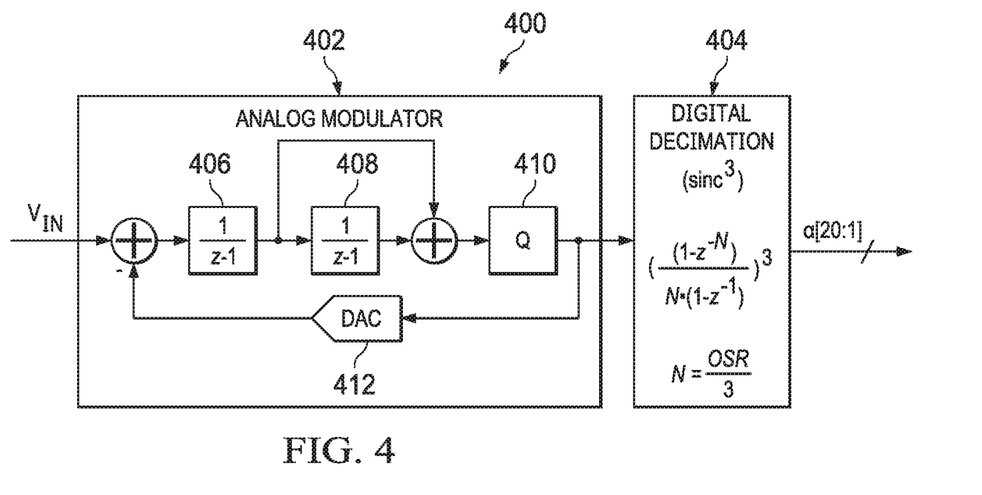
FIG. 4 is a block diagram of an example delta-sigma ADC.

FIG. 4 shows an example schematic architecture of a second-order delta-sigma modulator ADC 400. For example, ADC 400 can correspond to ADC 304 of FIG. 3 or to the combination of integrator 302 and ADC 304 of FIG. 3. ADC 400 has an input that receives an analog input signal $V_{IN}$, which ADC 400 processes to produce a multi-bit digital output signal a at an output of ADC 400. For simplicity, ADC 400 is illustrated as single-ended. In the illustrated example, ADC 400 is implemented as two stages in series: an analog modulator 402 and a digital decimation filter 404. For example, digital decimation filter can perform a sinc-cubed function based on an oversampling ratio (OSR). In the illustrated example, analog modulator 402 includes a first integrator 406 and a second integrator 408 in series. A fed-forward output of first integrator 406 and the output of the second integrator 408 can be summed together and quantized by single-bit quantizer 410. This quantized output can be fed into the digital decimation filter 404 and fed back through a single-bit digital-to-analog converter (DAC) 412 to be subtracted from the analog input signal $V_{IN}$ as part of a negative feedback loop in analog modulator 402. For simplicity, a dynamic reference and a trim capacitor are not shown in FIG. 4.

Figure 5:
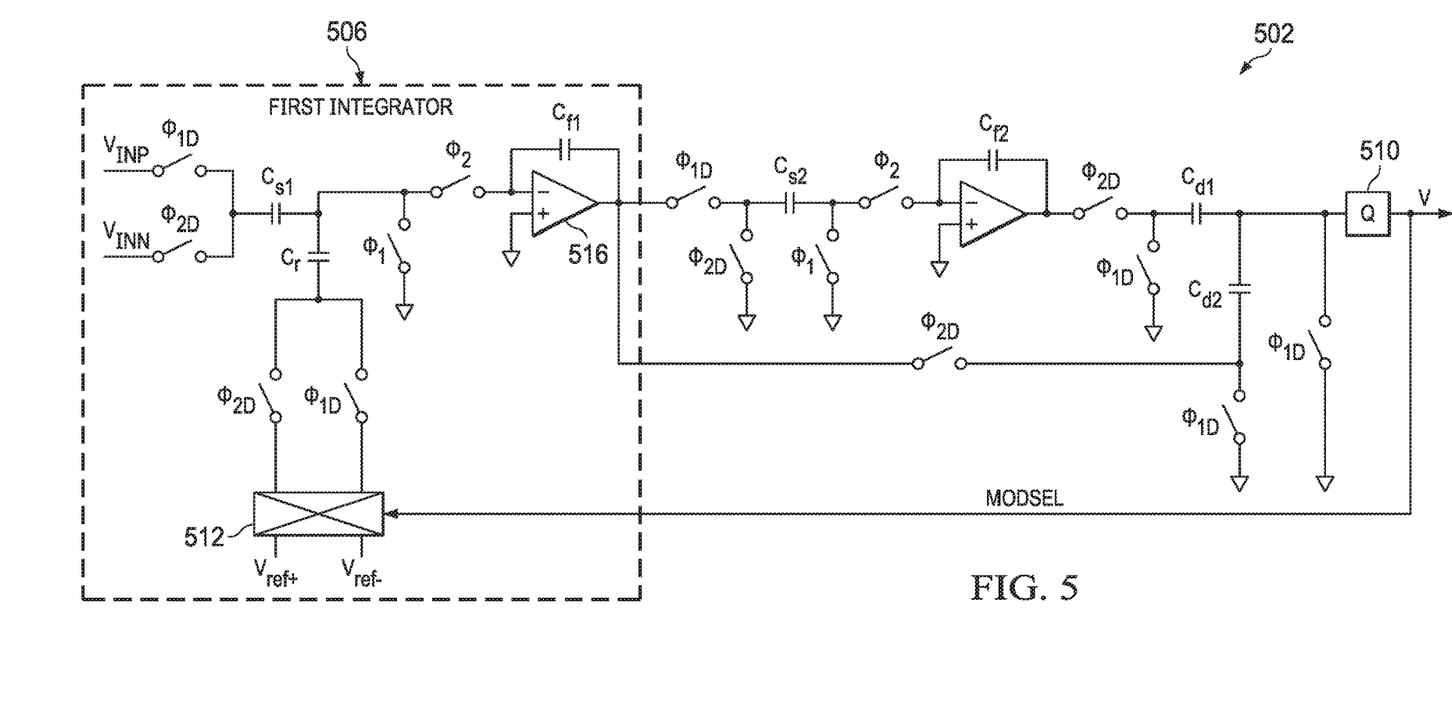
FIG. 5 is a schematic diagram of an example analog modulator of a delta-sigma ADC.
Figure 6:
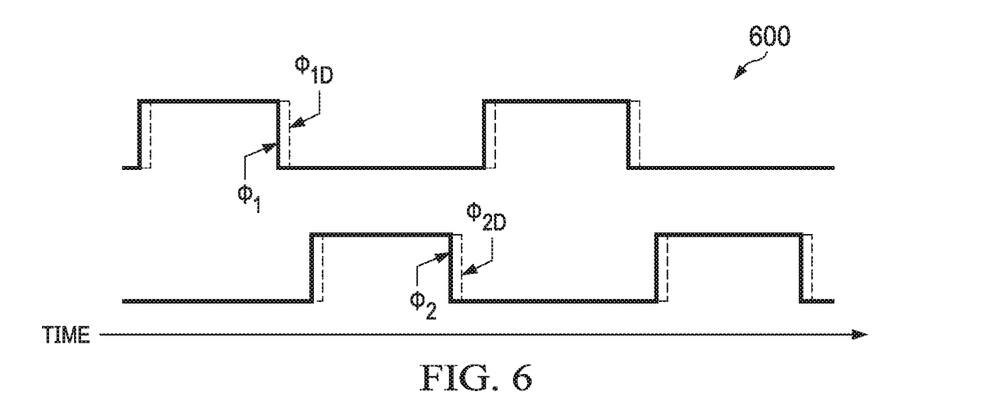
FIG. 6 is a timing diagram of example switching phases used in the integrator of FIGS. 5 and 7.

FIG. 5 is a schematic diagram of an example analog modulator 502 that can correspond to analog modulator 402 of FIG. 4. In the illustrated example 502, the input analog voltage signal is illustrated as being a differential signal $V_{INP}$, $V_{INN}$. First integrator 506, which can correspond to integrator 406 from FIG. 4, includes an operational amplifier (op amp) 516 configured, with feedback capacitor $C_{fi}$, as an integrator. Single-bit quantizer 510 can correspond to single-bit quantizer 410 in FIG. 4. The single-bit output V can be supplied as a mode selection signal MODSEL through a negative feedback loop to a cross-bar switch 512. Mode selection signal MODSEL controls a multiplexer made up of a cross-bar switch 512 and two associated single-pole, single-throw (SPST) switches, which switches are switched according to the timing illustrated in FIG. 6. The cross-bar switch 512 can be set to one of: (a) a bar state in which each of two input signals is respectively passed straight through to each of two outputs; or (b) a cross state in which each input is routed to the other respective output. At the outputs of cross-bar switch 512, SPST switches control the passage of the positive and negative reference voltages $V_{ref+}$, $V_{ref-}$ to analog modulator reference capacitor Cr. These switches and others illustrated in FIG. 5 can be switched in accordance with the clock timing diagram 600 shown in FIG. 6. For example, as shown, the differential inputs $V_{INP}$, $V_{INN}$ can be respectively switched according to clock waveforms $\phi_{1D}$, $\phi_{2D}$. Also as shown, the reference voltages (as output by cross-bar switch 512) can be switched according to clock waveforms $\phi_{1D}$, $\phi_{2D}$. As shown in FIG. 6, clock waveforms $\phi_{1D}$, $\phi_{2D}$ are time-delayed versions of clock waveforms $\phi_1$, $\phi_2$, respectively, and other switches in modulator 502 are switched according to clock waveforms $\phi_1$, $\phi_2$. For simplicity, a dynamic reference and a trim capacitor are not shown in FIG. 5.

Figure 7:
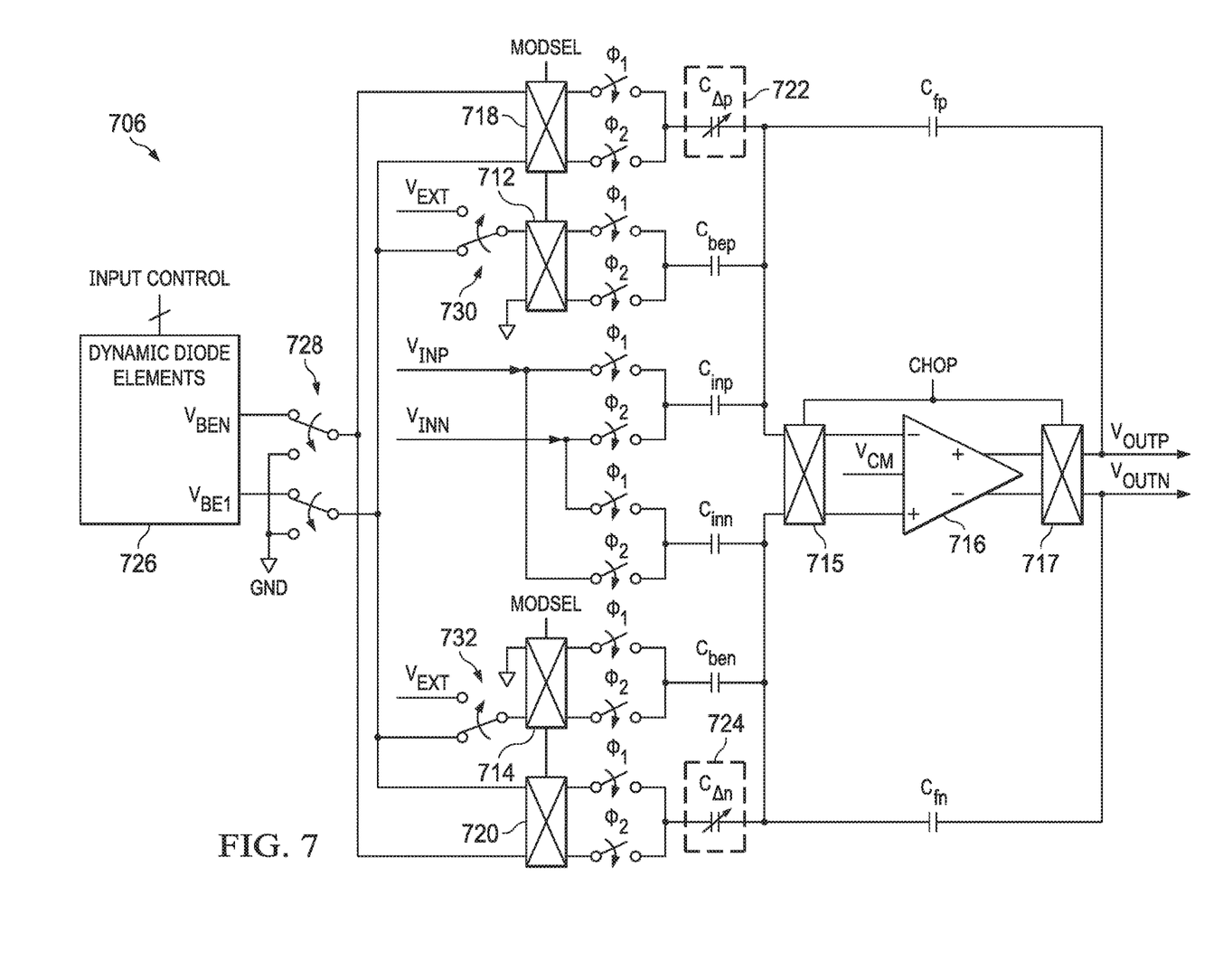
FIG. 7 is a schematic diagram of an example differential delta-sigma ADC integrator with input capacitors for reference voltage synthesis and trimmable capacitors for calibration.

FIG. 7 is a schematic diagram of an example delta-sigma ADC integrator 706 with input capacitors $C_{inp}$, $C_{inn}$ for reference voltage synthesis. In normal operation (i.e., outside of a calibration mode described in greater detail with regard to FIG. 11), integrator 706 samples the voltage $V_{BE1}$ produced by dynamic diode elements 726, and samples the differential voltage $V_{BEN}$ minus $V_{BE1}$, and combines these two samples with an amplifier 716, which is also fed a common mode voltage $V_{CM}$, to generate a constant differential reference voltage $V_{OUTP}$, $V_{OUTN}$ that is substantially stable across a range of operating temperatures. The integrator 706 of FIG. 7 thus represents a switched-capacitor bandgap voltage reference of effectively arbitrary bandgap value. For example, integrator 706 can correspond to first integrator 506 of FIG. 5. But in contrast with integrator 506 of FIG. 5, integrator 706 of FIG. 7 is illustrated as being fully differential, with a negative ("n") counterpart component for each positive ("p") capacitor component.

The differential base-emitter capacitors $C_{ben}$, $C_{bep}$ in FIG. 7 can each sample a diode voltage supplied by dynamic diode elements 726, which, as described below with regard to FIG. 8, can have arrays of diodes and current sources configurably connected together by switches controlled by a multi-bit input control signal to produce voltages $V_{BEN}$ and $V_{BE1}$. As shown, the base-emitter capacitors $C_{bep}$, $C_{ben}$ are each respectively connected to a multiplexer. Each respective multiplexer is illustrated as including a cross-bar switch 712 or 714 and associated SPST switches, labeled with switch phases $\phi_1$, $\phi_2$, that can be switched in accordance with the timing diagram of FIG. 6, to receive either voltages supplied by dynamic diode elements 726 (e.g., in normal operation) or an external voltage $V_{EXT}$ (such as may be supplied during a post-fabrication test/calibration phase for the purposes of reference calibration). Differential base-emitter capacitors $C_{ben}$, $C_{bep}$ can be disconnected from the outputs of the dynamic diode elements 726 and connected to the post-fabrication test/calibration external voltage using single-pole, double-throw (SPDT) external-voltage switches 730, 732.

Trimmable (dynamically adjustable) capacitors $C_{\Delta p}$ 722 and $C_{\Delta n}$ 724 can sample the difference between two diode voltages supplied by dynamic diode elements 726 via respective multiplexers that respectively include cross-bar switches 718, 720. Trimmable capacitors $C\Delta p$ 722 and $C\Delta n$ 724 can also be disconnected from the dynamic diode elements 726 and grounded (e.g., during the post-fabrication test/calibration phase) using SPDT grounding switches 728. Although not shown in FIG. 7, trimmable capacitors $C_{\Delta p}$ 722 and $C_{\Delta n}$ 724 can be provided with multi-bit input control signals (as is shown with respect to dynamic diode elements 726), also referred to herein as "control bits," to actuate the trimming (adjustment) of capacitance values of capacitors $C_{\Delta p}$ 722 and $C_{\Delta n}$ 724. Trimmable capacitors are described with reference to FIG. 9.

Still with reference to FIG. 7, a differential input voltage $V_{INP}$, $V_{INN}$ (which, for example, can correspond to the same-named inputs from FIG. 5) can be sampled onto a pair of input capacitors $C_{inp}$, $C_{inn}$ (which, for example, together can correspond to input capacitor $C_{s1}$ of FIG. 5). Also for example, during normal operation, input voltage $V_{INP}$, $V_{INN}$ can be supplied by a system battery, but during the post-fabrication test/calibration phase, input voltage $V_{INP}$, $V_{INN}$ can be supplied as a stable voltage from external test equipment. The trimmable capacitors $C_{\Delta p}$ 722 and $C_{\Delta n}$ 724 can be finely trimmed during this test/calibration phase to adjust the ratio of the capacitance of a respective base-emitter capacitor $C_{bep}$ or $C_{ben}$ to the capacitance its respective trimmable capacitor $C_{\Delta p}$ 722 or $C_{\Delta n}$ 724. Differential-output operational amplifier 716 can correspond to operational amplifier 516 of FIG. 5. Integrator feedback capacitors $C_{fp}$, $C_{fn}$ can together correspond to capacitor $C_{f1}$ of FIG. 5.

Differential-output operational amplifier 716 in FIG. 7 can be configured as a chopper amplifier by providing an input modulation circuit 715 and an output demodulation circuit 717, such as commutating cross-bar switches that are both fed a chopping signal CHOP. The commutating switches on the input and output synchronously reverse the polarity. Because both differential input and output are reversed simultaneously, the net effect on the output is a constant signal path polarity. Offset and flicker noise (a slow time-varying offset voltage) can thereby be eliminated.

As described above with regard to integrator 506, the switched-capacitor circuit of integrator 706 can operate in phases, in accordance with the timing diagram shown in FIG. 6. SPST switches shown in FIG. 7 can be actuated approximately complementarily in accordance with the $\phi_1$ and $\phi_2$ clock timing waveforms of FIG. 6. Cross-bar switches 712, 714, 718, 720 can be actuated according to a mode selection signal MODSEL that can be a single-bit ADC modulator feedback signal as shown in FIG. 5. The switched-capacitor circuit can sample voltage $V_{BE1}$ (from dynamic diode elements 726) with respect to ground in each phase on base-emitter capacitors $C_{bep}$ and $C_{ben}$, and can sample the differential $V_{BE1}$ with respect to $V_{BEN}$ on the trimmable capacitors $C_{\Delta p}$ 722 and $C_{\Delta n}$ 724.

Figure 8:
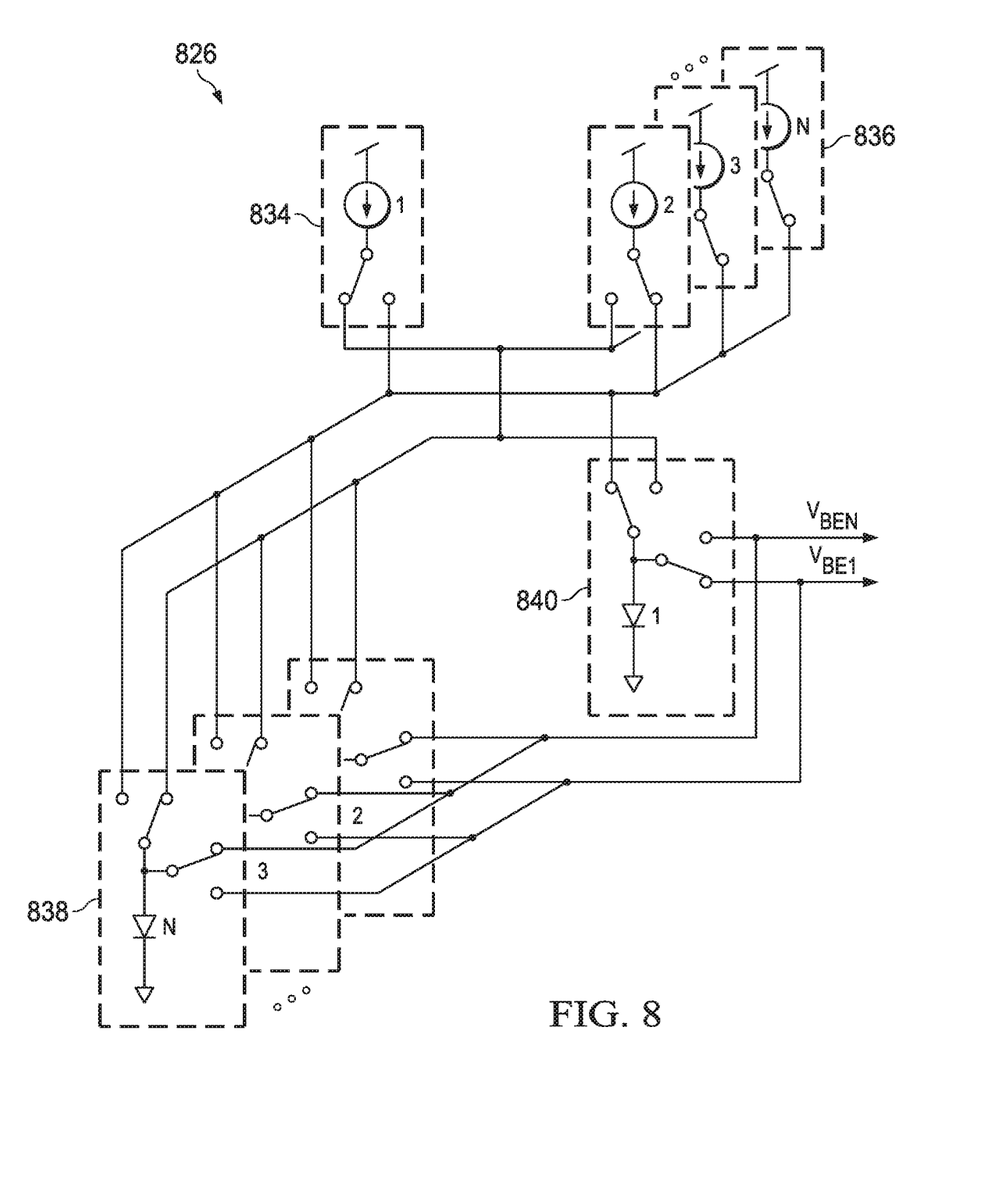
FIG. 8 is a schematic of example dynamic diode elements.

FIG. 8 is a schematic of an example of the components that can form dynamic diode elements 826, which can correspond to dynamic diode elements 726 of FIG. 7. Groups of current sources 834, 836 and diodes 838, 840 can be set by the illustrated switches to a desired ratio to create a voltage difference between voltage signals $V_{BE1}$ and $V_{BEN}$. The current sources 834, 836 and the diodes 838, 840 can be dynamically element matched over each ADC conversion during the oversampling process. In the illustrated example, first diode 840 and second through Nth diodes 838 are illustrated as each comprising a single diode, but optionally they can each be configured to instead comprise M diodes in series. These stacks of M diodes in series can, in effect, adjust the diode voltage $V_{BE1}$ to a desired minimum temperature coefficient voltage ("target voltage" or sometimes called "magic voltage"), which is an M-multiple of about 1.2 volts (where M is an integer two or greater). Altering the size of each such diode will not, by itself, change the target voltage because of the property that the bandgap voltage of silicon is about 1.2 volts. For example, if each element 840, 838 is configured to include two diodes in series, then the target voltage will be adjusted to about 2.4 volts. As another example, if each element 840, 838 is configured to include three diodes in series, then the target voltage will be adjusted to about 3.6 volts. Each element 840, 838 can include resistor dividers to further adjust the target voltage.

A semiconductor-based diode biased with a constant current generates a voltage that is complementary to absolute temperature (CTAT). Accordingly, as temperature increases, the voltage across the diode decreases linearly with the change in temperature. For two diodes of different sizes, the cross-diode voltage for each diode decreases linearly with increase in temperature. But given the same current bias, the cross-diode voltage of the bigger diode tends to drop faster than that of the smaller diode (the smaller diode's temperature coefficient is lower). A difference between the two cross-diode voltages is a linear proportional-to-absolute-temperature (PTAT) voltage. A bandgap voltage reference takes a CTAT diode voltage and combines it with the PTAT difference of two diode voltages to create a constant voltage, which in effect cancels the CTAT function of one diode with the differential PTAT voltage of a pair of diodes to create a constant-with-temperature (CWT) reference.

In FIG. 8, dynamic diode elements 826 include a first diode (or first set of M diodes in series) 840 and an array of second through Nth diodes (or M diodes in series) 838, along with a first current source 834 and an array of current second through Nth current sources 836 at the top. Switches link diodes and current sources together in configurations that can be adjusted dynamically to provide element matching. The current sources and the diodes generate: (a) voltage $V_{BE1}$, which is CTAT (has a negative temperature coefficient) because $V_{BE1}$ has a constant current going into a diode; and (b) voltage $V_{BEN}$, which is also CTAT (also has a negative temperature coefficient), but because it has many diodes, is actually a little bit more negative than $V_{BE1}$. A difference between $V_{BE1}$ and $V_{BEN}$ is a voltage that is positive with respect to temperature, PTAT.

In dynamic element matching, with each sample of the supplied voltages $V_{BE1}$ and $V_{BEN}$, the current sources and diodes are cycled through. Accordingly, as the input is oversampled, by the time a full conversion of the input is made (and assuming the input voltage has not changed over this time period), the diode voltage $V_{BE1}$ includes contributions from every individual diode (or set of M series diodes) 1-N and every individual current source 1-N. This reduces errors from component mismatch, because diode No. 1 may not be perfectly matched to diode No. 2, which may not be perfectly matched to diode No. 3, etc., and the same is true for the current sources 1-N. The structure of FIG. 8 provides the ability to dynamically element-match the current sources and the diodes over the course of an oversampled conversion, such that every diode will be used in the single-diode measurement, and every current source individually will be used to bias the single diode, thus maximizing accuracy.

Thus, the $C_A$ capacitors 722, 724 of FIG. 7 can, in effect, provide the PTAT contribution to the reference voltage, and the $C_{BE}$ capacitors can provide the CTAT portion of the reference voltage, which can be taken as $V_{OUTP}$-$V_{OUTN}$. In each cycle, the respective output signal $V_{OUT}$ is a scaled reference of input voltage $V_{IN}$, scaled based on the respective feedback capacitor $C_f$. Although bandgap voltage references usually generate reference voltages of approximately 1.2 volts, circuit 706 is capable of supplying a reference voltage of arbitrary (designable) value.

Figure 9:
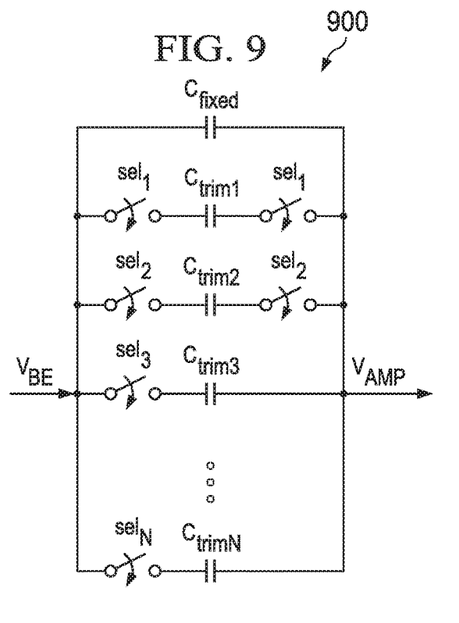
FIG. 9 is a schematic of an example trimmable capacitor.

FIG. 9 shows an example circuit structure 900 of a trimmable capacitor, which is useful to create each of the trimmable capacitors 722, 724 of FIG. 7. The structure 900 includes a parallel array of N switched capacitors of progressively smaller sizes $C_{trim1}$ to $C_{trimN}$ in parallel with a fixed capacitor $C_{fixed}$. (Note that this N of FIG. 9 is not required to be the same as the N diodes described with regard to FIG. 8.) The total capacitance of the structure 900 is dependent upon the application of control bits to switch SPST switches labeled $sel_1$ through $sel_N$. Larger capacitors $C_{trim1}$ and $C_{trim2}$ can be provided with two switches (instead of one switch) to reduce parasitics on the sensitive amplifier voltage node.

To achieve any particular capacitance value, and thus to achieve a particular digital output code at the output of the ADC in which the trimmable capacitors are implemented, a successive-approximation binary search can be used. Switches are adjusted to set the trim at the middle of its range, which is either exactly equal to, greater than, or less than the desired trim. If exactly equal, then then binary search is complete and the trim has been successfully set. If not equal, then the switches are adjusted to set the trim at the one-quarter value or three-quarters value of its range, depending on which half of the range the desired trim falls within. The process continues successively, narrowing the range by half with each iteration and zeroing in on the desired trim, until the desired trim is achieved. In this way, for a 7-bit trim capacitor having $2^7$=128 possible capacitance levels, the optimal code of control bits can be arrived at in a maximum of about seven or eight successive iterations.

Figure 10:
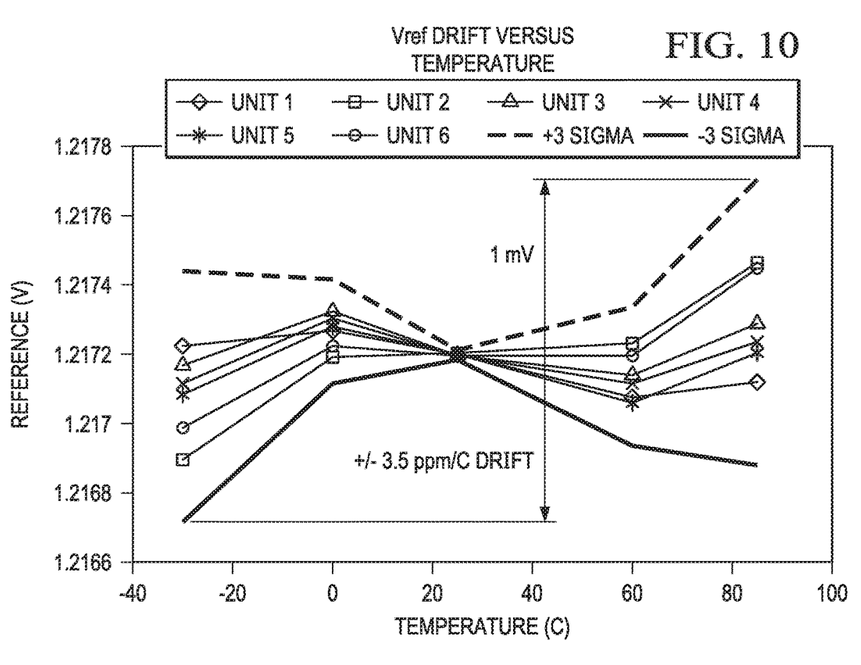
FIG. 10 is a graph of measured-reference-voltage-stability-across-temperature hardware performance for six different fabricated voltage reference units.
Figure 11:
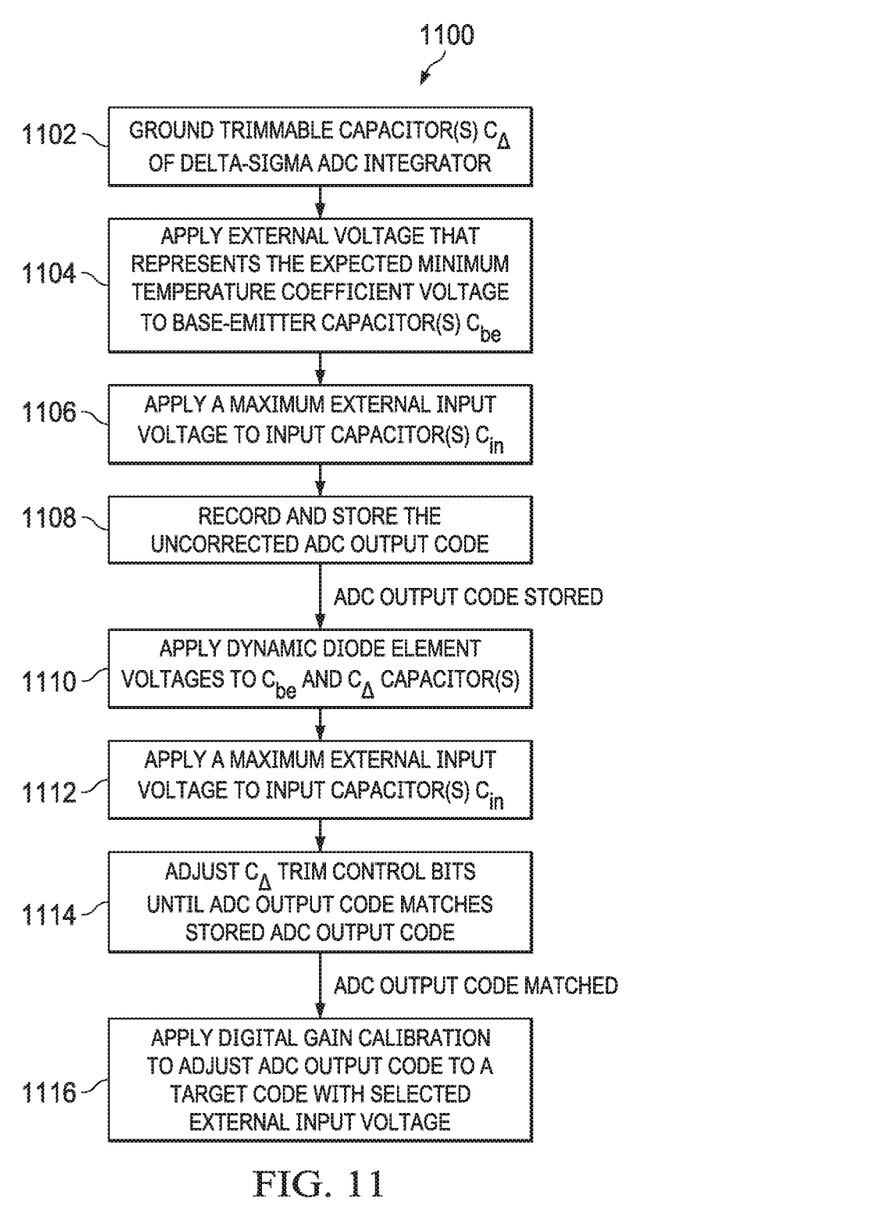
FIG. 11 is a flow chart of an example method for performing calibration of a switched-capacitor voltage reference by trimming a reference voltage at a single temperature point.

The graph of FIG. 10 illustrates the measured-reference-voltage-stability-across-temperature hardware performance for six different voltage reference units, which are each fabricated according to the design described above with reference to FIGS. 3-9 and calibrated according to the trim technique of FIG. 11. The vertical axis is the reference voltage, which is the output voltage produced by the voltage reference. The horizontal axis is temperature in degrees Celsius. As shown, very good reference voltage stability is achieved across the range of expected operating temperatures, between about −30° C. and about 90° C., even though each unit is trimmed at only a single temperature (in this illustrated case, at room temperature, about 25° C.). FIG. 10 thus shows the accuracy across temperature provided by the trim technique, even though the voltage reference is trimmed only at room temperature.

The flow chart of FIG. 11 illustrates a method 1100 for performing calibration of a switched-capacitor voltage reference (like circuit 706 of FIG. 7) by trimming a reference voltage at a single temperature point (e.g., room temperature). The illustrated calibration method 1100 may at least partially occur during a post-fabrication test/calibration phase, during which a fabricated integrated circuit (IC) that includes voltage reference circuitry is connected to test/calibration equipment, before delivery of the IC to a systems integrator and integration of the IC into a larger system. For example, the IC can be a high-accuracy battery monitor and/or protector for battery packs, such as for lithium-ion, lithium-polymer, or lithium iron phosphate battery packs. Method 1100 includes three phases, which are: storing an ADC output code, matching the ADC output code, and applying digital gain calibration to adjust the ADC output code to a target code. The target code can be common to all fabricated devices of the same configuration.

To first store the ADC output code, at the outset of the calibration method 1100, during a post-fabrication test/calibration phase, trimmable capacitors (e.g., capacitors $C_{Ap}$ 722, $C_{An}$ 724 of FIG. 7) of a delta-sigma ADC integrator (e.g., integrator 706 of FIG. 7) can be grounded 1102. In the example integrator architecture 706 of FIG. 7, this can be accomplished by switching trimmable capacitor grounding switches 728 to a grounding position. An external test reference voltage that represents the expected minimum temperature coefficient voltage can be applied 1104 to base-emitter capacitors (e.g., capacitors $C_{bep}$, $C_{ben}$ of FIG. 7) of the delta-sigma ADC integrator, such as by applying this voltage to a test reference voltage node ($V_{EXT}$ in FIG. 7) and making appropriate circuit switching to supply this voltage to the base-emitter capacitors (e.g., by throwing SPDT switches 730, 732 in FIG. 7). For example, this external test reference voltage can be set at a so-called "target voltage," which is a minimum temperature coefficient voltage (e.g., between about 1.2 volts and about 1.3 volts, e.g., 1.2172 volts) at which the voltage reference has the minimum temperature coefficient. Above this target voltage, the voltage reference trends towards PTAT, so it outputs a reference voltage that becomes more positive with increased temperature; below this target voltage, the voltage reference trends towards CTAT, so it outputs a reference voltage that becomes more negative with increased temperature.

Subsequently or substantially simultaneously, a stable external input voltage that can correspond to the maximum external input voltage expected of the circuit (e.g., 1 volt) can be applied 1106 (e.g., at the $V_{INP}$ and $V_{INN}$ nodes in the example of FIG. 7) to the input capacitors (e.g., capacitors $C_{inp}$, $C_{inn}$ of FIG. 7). At this point, the ADC (of which the integrator can be a part) outputs a digital code (e.g., at multi-bit output a in ADC 400 in FIG. 4), and that ADC output code corresponds to the externally-applied target voltage (e.g., applied at $V_{EXT}$ in FIG. 7). This "uncorrected" ADC output code can be recorded and stored 1108. At this point, the first phase of method 1100 is completed.

In the second phase of method 1100, the ADC output code is matched. The trimmable capacitors ($C_A$) are ungrounded (e.g., by switching trimmable capacitor grounding switches 728), and the external "target voltage" test reference voltage ($V_{EXT}$) is removed (e.g., by switching SPDT switches 730, 732). Dynamic diode element voltages (e.g., from elements 726) can thus be applied 1110 to the base-emitter capacitors $C_{be}$ and trimmable capacitors $C_A$. The same stable, externally supplied input voltage (such as provided at the $V_{IN}$ nodes in the example of FIG. 7) can continue to be applied 1112 to the input capacitors ($C_{in}$). ADC conversions are then performed with the dynamic element voltages selected. The trimmable capacitors may then be trimmed (adjusted), such as by trimming control bits that control the switching of switches $sel_1$ through $sel_N$ in the example trimmable capacitor 900 of FIG. 9, until the same ADC output code earlier recorded 1108 is achieved 1114 under these dynamic-element-voltage conditions. As described above, the control bits can be trimmed using a successive-approximation binary search. With the ADC output code matched to the earlier recorded code, the second phase of method 1100 is completed.

In the third phase, a digital gain trim is applied 1116 to calibrate the system to a desired output code (a "target code") with a stable input voltage. For example, this digital gain trim can be provided by digital gain calibrator 306 in FIG. 3. The target code is common to all fabricated devices having a same configuration, especially those having a same number of output bits of the ADC. Because the ADC has a certain number of output bits (e.g., 16 bits, or 20 bits), a particular target code can be expected for a particular input voltage. Method 1100 permits each fabricated device to be calibrated, so that each fabricated device gives the same output code for a particular stable input voltage.

As an example, the target code can be derived by dividing the external input voltage applied in 1106 and 1112 of method 1100 by the target voltage applied in 1104 of method 1100, and multiplying by the maximum output code of the ADC, as dictated by the number of ADC output bits (e.g., $2^{16}$=65,536 for a 16-bit ADC, or $2^{20}$=1,048,576 for a 20-bit ADC). Accordingly, for example, for an applied input voltage of 1 volt, and an applied reference voltage of 1.2172 volts, the target code for a 16-bit ADC is approximately 53,842, and the target code for a 20-bit ADC is approximately 861,466.

By applying a stable reference voltage 1104 and a stable input voltage 1106 in the first phase of method 1100, the storing of the uncorrected ADC output code 1108 in effect stores the mismatch between the base-emitter capacitors $C_{be}$ and the input capacitors $C_{in}$. If the exact same $C_{be}$ to $C_{in}$ ratio is not achieved on a part-to-part basis, the ADC output code will change (part-to-part) based on the $C_{be}/C_{in}$ capacitor mismatch. Method 1100 thus provides a way to calibrate for the $C_{be}/C_{in}$ capacitor mismatch in an integrator, such as integrator 706 in FIG. 7.

The voltage reference and associated methods described herein provide a solution to trim and calibrate the ratio between the base-emitted capacitors $C_{be}$ and the trimmable capacitors $C_A$. Such a technique allows for correction of mismatches between the $C_{be}$, $C_A$, and $C_{in}$ capacitors, thereby preventing the introduction of a temperature coefficient into the dynamic voltage reference, with a single-temperature trim. In some examples, the capacitor ratio of $C_{be}$ and $C_A$ can be fixed at time of mask release. In other examples, the voltage reference described herein can mitigate mismatches, even when the target voltage is not known until hardware characterization is completed. Accordingly, the described voltage reference has the benefits of being calibratable with a simple repeatable routine, which allows accurate trim of the reference to the desired voltage at room temperature only, without increasing the current consumption or area of the device or reducing other performance metrics. The voltage reference described herein has the further advantage of being designable for an arbitrary target voltage by providing series diodes, and resistor dividers in some examples, in its dynamic diode elements.

The systems described herein can be implemented, and the methods described herein can be carried out, using an application-specific integrated circuit (ASIC) or multiple ASICs. In this description, the term "based on" means based at least in part on. Also, in this description, the term "couple" or "couples" means either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is described herein as including certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, such as by an end-user and/or a third-party.

Modifications are possible in the described embodiments, and other embodiments are possible, within the scope of the claims.

What is claimed is:

1. An integrated circuit (IC) comprising:
a single-ended or differential switched-capacitor voltage reference comprising:
dynamic diode elements configured to provide first and second diode voltages;
an input capacitor configured to sample an input voltage;
a base-emitter capacitor configured to sample the first diode voltage with respect to a ground;
a dynamically trimmable capacitor configured to sample the first diode voltage with respect to the second diode voltage; and
an operational amplifier (op amp) coupled at an op amp input to the input capacitor, the base-emitter capacitor, and the dynamically trimmable capacitor, the op amp configured to provide a reference voltage based on the sampled input voltage, the first and second diode voltages, and a trim of the trimmable capacitor.

2. The IC of claim 1, wherein the voltage reference is configured as a first integrator of a modulator stage of a delta-sigma analog-to-digital converter (ADC).

3. The IC of claim 2, wherein the ADC is configured to output a digital code indicative of capacitor mismatch.

4. The IC of claim 3, wherein the trimmable capacitor is trimmed based on the digital code.

5. The IC of claim 1, wherein the voltage reference comprises an external voltage switch coupled to an input of the base-emitter capacitor and configured to selectably uncouple the base-emitter capacitor from the dynamic diode elements and to couple the base-emitter capacitor to an externally supplied test voltage, such that the base-emitter capacitor samples the externally supplied test voltage instead of the first diode voltage.

6. The IC of claim 5, wherein the externally supplied test voltage is configured to be provided as a minimum temperature coefficient voltage at which the voltage reference has a minimum temperature coefficient.

7. The IC of claim 6, wherein the dynamic diode elements comprise stacks of M series diodes configured to adjust the first diode voltage to a minimum temperature coefficient voltage that is an M-multiple of a bandgap voltage.

8. The IC of claim 7, wherein the bandgap voltage is the bandgap voltage of silicon.

9. The IC of claim 1, wherein the voltage reference comprises a trimmable capacitor grounding switch coupled to an input of the trimmable capacitor and configured to selectably uncouple the trimmable capacitor from the dynamic diode elements and couple the trimmable capacitor to the ground.

10. A method comprising:
grounding an input to a trimmable capacitor of a differential switched-capacitor voltage reference, the voltage reference configured as a first integrator of a delta-sigma analog-to-digital converter (ADC);
applying an external test reference voltage to a base-emitter capacitor of the voltage reference;
applying a maximum external input voltage to an input capacitor of the voltage reference;
recording and storing an uncorrected output code from the ADC;
applying dynamic diode element voltages to the base-emitter capacitor and the trimmable capacitor;
applying the maximum external input voltage to the input capacitor; and
adjusting trim control bits controlling a trim of the trimmable capacitor until a new output code from the ADC matches the stored uncorrected output code.

11. The method of claim 10, further comprising applying digital gain calibration to adjust the new output code to a target code with the maximum external input voltage applied.

12. The method of claim 10, wherein the external test reference voltage is an expected minimum temperature coefficient voltage ("target voltage") of the voltage reference.

13. The method of claim 12, wherein the dynamic diode element voltages are supplied using a dynamic element-matching diode array comprising M diodes in series and the dynamic element-matching diode array is configured to adjust at least one of the dynamic diode element voltages to the target voltage that is an M-multiple of a bandgap voltage.

14. The method of claim 13, wherein the bandgap voltage is the bandgap voltage of silicon.

15. The method of claim 10, wherein the method is performed at a single temperature point.

16. The method of claim 10, wherein the method is performed during a post-fabrication test/calibration phase, during which a fabricated integrated circuit (IC) that includes the voltage reference is connected to test/calibration equipment.

17. A system comprising:
a delta-sigma analog-to-digital converter (ADC) comprising:
an analog modulator comprising a single-ended or differential switched-capacitor voltage reference configured as a first-stage integrator of the analog modulator, the voltage reference comprising a dynamically trimmable capacitor configured to receive a trim control signal to adjust its capacitance;
a multi-bit output configured to produce a digital output code based on an input voltage provided to the voltage reference and the trim control signals.

18. The system of claim 17, further comprising a digital-logic gain calibration circuit coupled to the multi-bit output of the ADC and configured to adjust the digital output code with a gain trim to provide a gain-calibrated output code.

19. The system of claim 18, wherein the gain calibration circuit is configured to calibrate the system to a target code with a stable input voltage.

20. The system of claim 19, wherein the target code is based on an external input voltage applied to base-emitter capacitors of the voltage reference, divided by a minimum temperature coefficient voltage of the voltage reference ("target voltage"), multiplied by a maximum output code of the ADC determined by the number of bits in the multi-bit output of the ADC.

* * * * *